Oct. 9, 1962 J. T. LYNCH 3,058,007

LOGIC DIODE AND CLASS-A OPERATED LOGIC TRANSISTOR GATES IN TANDEM FOR RAPID SWITCHING AND SIGNAL AMPLIFICATION

Filed Aug. 28, 1958

INVENTOR.
JOHN T. LYNCH

BY Edward W. Hughes

ATTORNEY 3,058,007

LOGIC DIODE AND CLASS-A OPERATED LOGIC TRANSISTOR GATES IN TANDEM FOR RAPID SWITCHING AND SIGNAL AMPLIFICATION

John T. Lynch, Lionville, Pa., assignor to Burroughs Corporation, Detroit, Mich., a corporation of Michigan Filed Aug. 28, 1958, Ser. No. 757,859
10 Claims. (Cl. 307—88.5)

This invention relates to switching networks, and more particularly to very high speed switching networks.

Switching networks may be designed with the aid of Boolean algebra, a subdivision of methematical logic, since Boolean algebraic expressions provide convenient means for symbolically representing such networks. In designing a given switching network in this manner, the circuit designer writes an equation which defines the desired operation, or function, of the network. A network having the desired function may then be constructed by interconnecting logic circuits as indicated by the equation, where logic circuits are mechanizations of, or the functional equivalent of, Boolean algebraic functions.

In general, Boolean algebraic equations for switching networks may be expressed in terms of "and" functions and "or" functions. Thus, a switching network may be constructed by using logical "and" circuits to perform the "and" functions of the equation defining the network, and by using logical "or" circuits to perform the "or" functions of the equations. The mechanization of "and" functions, "or" functions, are also sometimes referred to in the art as being "and" and "or" gates.

One common method of forming a switching network is by interconnecting diode "and" and "or" gates. The initial input signals of the network are generally obtained from bistable circuits such as flip flops, and are at one or the other of two voltage levels. After the signals have passed through two or three diode gates, the amplitudes of the signals are attenuated by the impedances of the diodes so that they are no longer substantially at one or the other of the desired levels. To overcome the attenuation of the signals as they pass through the gates, it has heretofore been necessary to incorporate amplifying circuits in the network so that the signals throughout the network are maintained at the desired levels. This solution to the problem of attenuation of the signals, however, creates other problems; namely, that of delays introduced by the amplifier circuits and that resulting from inversion of the signals.

The active elements of amplifier circuits generally used in switching networks are designed either to be cut off, or to be saturated. When the active elements are semiconductor amplifiers, transistors, the turn off and turn on times of the transistors introduce substantial additional delays. Also, the most common transistor amplifying circuits operate the transistors in the common emitter mode which inverts the signals. In order to avoid changing the definition, or significance of the two-valued signals, it is necessary to use a second inverter, where an inverter is a mechanization of the Boolean "not" function, so that the definition of the signal levels are unchanged. The use of a second amplifying inverter, of course, doubles the delays. However, if the second inverter is not used, the logic must be inverted which obviously complicates construction of a switching network.

Thus in a switching network which requires amplifying circuits separate from the logic circuits, the overall time for the switching circuit to perform its desired function is increased. The speed of a switching network is usually given in terms of the average delay per stage, or per gate, where average delay is obtained by dividing the total time between application of input signals and the obtaining of an output signal by the number of stages, or gates. In diode switching networks using high speed diodes and amplifying circuits, the average delay per gate is on the order of a half a microsecond, well above the theoretical minimum period of delay per gate.

In order for a switching network to approach its maximum theoretical speed, i.e., with a minimum average period of delay for each gate, it is necessary to eliminate the need for amplifying the output signals of the gates after such signals have passed through two or three diode gates. In this invention, this is accomplished by using transistorized gates for either the "or" gates or the "and" gates. In the transistorized gates the transistors have the same logical function as diodes, but they also provide sufficient current and power gain so that it is no longer necessary to have a separate amplifying stage between every two or three gates in a switching network. Further, the transistorized gates do not invert the signals so that complications resulting from undesired inversion of the signals are not created. The gate circuits are so designed that the transistors are operated class A, i.e., neither saturated nor cut off. Thus there are no delays due to minority carrier storage in the bases of the transistors, and the average delay per stage, or gate, in a switching network as described and claimed approaches the theoretical minimum, i.e., of the order of 5 millimicroseconds per stage with commercially available transistors and diodes.

It is therefore an object of this invention to provide a very high speed switching network.

It is another object of this invention to provide switching networks made by interconnecting logic circuits, in which at least one type of logic circuit produces current and power gain.

It is a further object of this invention to provide switching networks formed by interconnecting "and" and "or" gates in which the average delay per stage approaches its theoretical minimum.

It is a still further object of this invention to provide switching networks formed by interconnected "and" and "or" gates, and in which the delay per stage with present commercially available components is on the order of 5 millimicroseconds per stage.

It is still another object of this invention to provide logic circuits which may be interconnected to form switching networks, and in which the active elements for performing the functions of one type of such logic circuits provides current and power gain so that intermediate amplifying stages are not needed in such a network.

It is a further object of this invention to provide logic circuits which may be interconnected to form switching networks and in which the active elements for performing the functions of one type of such logic circuits provide current and power gain without inverting the signals.

Other objects and many of the attendant advantages of this invention will be readily appreciated as the same become better understood by reference to the following detailed description when considered in connection with the accompanying drawing wherein.

Figure 1:
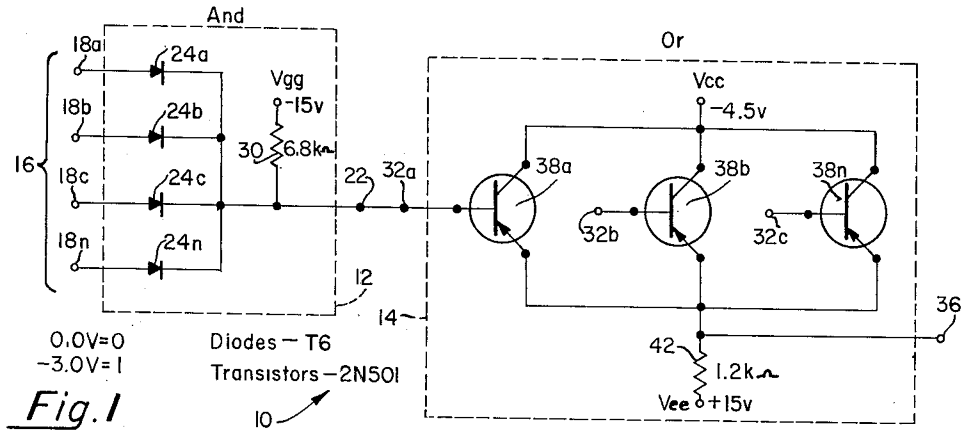
FIG. 1 is a schematic diagram of a switching network comprised of an "and" and "or" gate.

In FIG. 1, switching network 10 is comprised of "and" gate 12 and an "or" gate 14. "And" gate 12 has an input circuit 16 which consists of $n$ input terminals 18$a$, 18$b$—18$n$, where $n$ is an integer $\geqq 2$. Gate 12 also has a single output terminal 22. Connected between input circuit 16 and output terminal 22 are "$n$" diodes 24$a$, 24$b$—24$n$. The anode of each of the diodes 24$a$, 24$b$—24$n$ is connected respectively to a different one of the input terminals 18$a$, 18$b$—18$n$ of input circuit 16. The cathodes of diodes 24$a$, 24$b$—24$n$, are directly connected to the output terminal 22, and output terminal 22 is connected to a suitable source of gate potential $Vgg$ through gate resistor 30.

"Or" gate 14 has an input circuit which consists of $m$ input terminals 32$a$, 32$b$—32$m$, where "$m$" is an integer $\geqq 2$. Gate 14 also has a single output terminal 36. Connected between the input terminals 32$a$, 32$b$—32$m$ and output terminal 36 are $m$ transistors 38$a$, 38$b$—38$m$. The base of each of the transistors 38$a$, 38$b$—38$m$ is connected respectively to a different one of the input terminals 32$a$, 32$b$—32$m$. The emitters of transistors 38$a$, 38$b$—38$m$ are directly connected to output terminal 36. Output terminal 36 is also connected by emitter resistor 42 to a suitable source of emitter potential $Vee$, which is not illustrated. The collectors of the transistors 38$a$, 38$b$—38$m$ of gate 14 are connected to a suitable source of collector potential $Vcc$ which is not illustrated. Transistors 38$a$, 38$b$—38$m$, in FIG. 1, are illustrated as being PNP type transistors and are preferably junction type transistors. Switching network 10 is formed by directly connecting output terminal 22 of gate 12 to input terminal 32$a$ of gate 14. The input terminals 18$a$, 18$b$—18$n$ of gate 12 can be connected to the output terminals of other "or" gates; input terminals 32$a$, 32$b$—32$m$ of "or" gate 14 can be connected to the output terminal of other "and" gates; and output terminal 36 may be connected to the input terminals of a plurality of "and" gates, in order to form more complex switching networks.

The circuit illustrated in FIG. 1 having components of the type and/or value indicated on the drawing with voltage sources of the polarity and magnitudes indicated is adapted to have binary, or two-valued signals, of 0.0 volt or −3.0 volts applied to the input terminals of gates 12 and 14, and to produce similar binary signals at their output terminals. If an input signal of substantially 0.0 volt is denoted "0" and an input signal of substantially −3.0 volts is denoted "1," then gate 12 is a mechanization of the Boolean "and" function, since the voltage of output terminal 22 will be at the voltage denoted "1" if and only if the values of the signals applied to all the input terminals 18$a$, 18$b$—18$n$ are at the voltage denoted 1. Gate 14 is a mechanization of the Boolean "or" function since output terminal 36 will be at the voltage denoted "1" if and only if the value of one or more, including all of the signals applied to input terminals 32$a$, 32$b$—32$m$ is or are at the voltage denoted "1."

Figure 2:
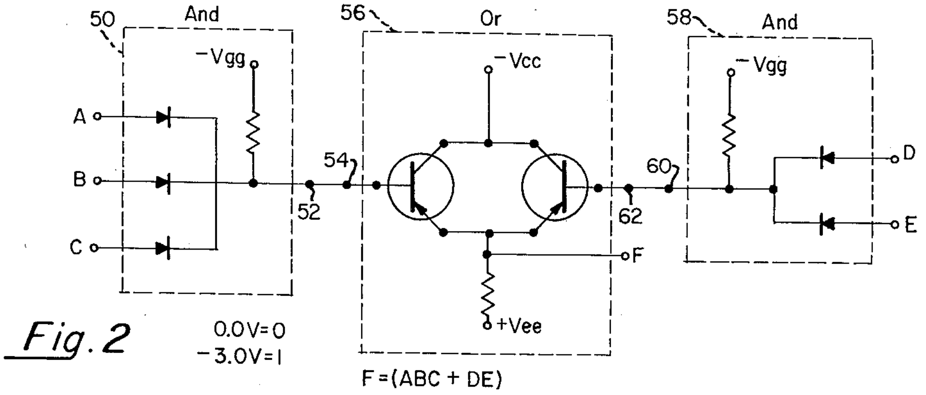
FIG. 2 is a schematic diagram of an "and," an "or," and an "and" gate interconnected to form a switching network.

In FIG. 2 there is illustrated a switching network which can be described as the following Boolean algebraic expression:

Eq. (1) $$F=(ABC+DE)$$

"And" gate 50 has three input terminals A, B and C. Its output terminal 52 is connected to one of the input terminals 54 of "or" gate 56. "And" gate 58 has two input terminals D, E, and its output terminal 60 is connected to the second input terminal 62 of gate 56. The output terminal for the network corresponds to the output terminal F of "or" gate 56. If an input signal of 0.0 volt is denoted 0 and an input signal of −3.0 volts is denoted "1," then the voltage of terminal F of gate 56 will have the value denoted "1" if all the signals applied to terminals A, B, C have the value denoted "1," or if all the signals applied to terminals D, E, have the value denoted "1." From this example, it is believed to be obvious how additional "and" and "or" gates can be interconnected to form more complex switching networks.

Figure 3:
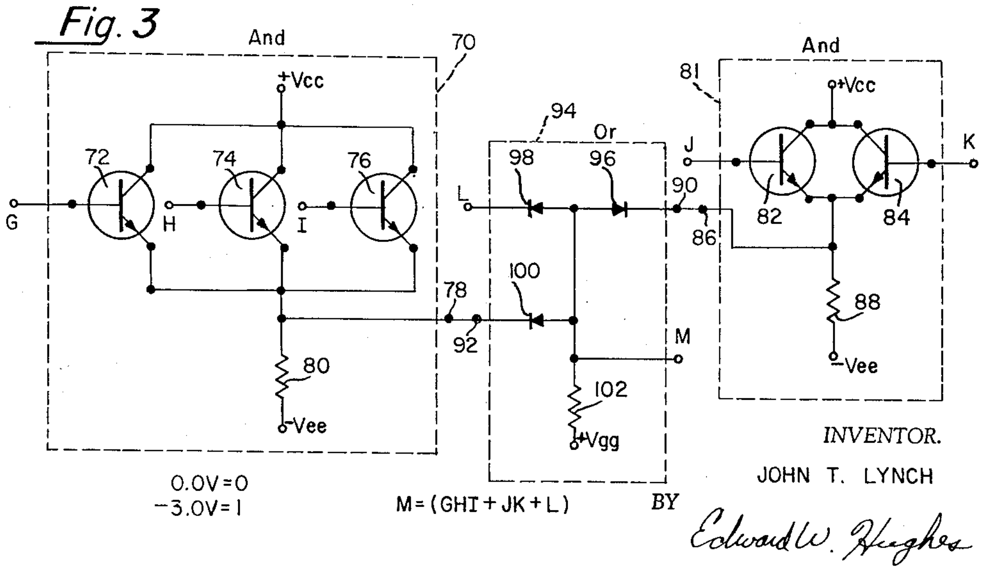
FIG. 3 illustrates a modification of the invention.

In FIG. 3, a modification of the invention is illustrated. In FIG. 3 NPN transistors replace the diodes of "and" gate 70, and diodes replace the PNP transistors of the "or" gate. Input terminals G, H and I of gate 70 are directly connected respectively to the bases of NPN transistors 72, 74, 76. The emitters of transistors 72, 74, 76 are directly connected to the output terminal 78 of gate 70; and output terminal 78 is connected through emitter resistor 80 to a suitable source of emitter potential $Vee$, which is not illustrated. The collectors of transistors 72, 74, 76 are directly connected to a voltage source of collector potential $Vcc$, which is not illustrtaed.

"And" gate 81 is illustrated as having two input terminals J and K which are respectively connected to the bases of NPN transistors 82, 84. Output terminal 86 of gate 81 is directly connected to the emitters of transistors 82, 84, and also through emitter resistor 88, to a suitable source of emitter potential $Vee$ which is not illustrated. The collectors of transistors 82, 84 are connected to a suitable source of collector potential $Vcc$ which is not illustrated.

The input terminals 90, L, and 92, of "or" gate 94 are connected respectively to the cathodes of diodes 96, 98, 100. The anodes of diodes 96, 98, 100 are connected to output terminal M. Gate resistor 102 connects output terminal M to a suitable source of gate potential $Vgg$. Output terminal 78 of gate 70 is connected to input terminal 92 of gate 94, and output terminal 86 of gate 81 is connected to input terminal 90 of gate 94.

The switching network illustrated in FIG. 3 may be defined by, or is a mechanization of, the following Boolean algebraic expression:

Eq. (2) $$M=(GHI+JK+L)$$

For binary input signals having the values identified supra, the output signal of the network at terminal M will be at the voltage denoted "1" if the input signal applied to terminal L has the value denoted "1," or if both the input signals applied to terminals J and K have the value denoted "1," or if the input signals applied to the terminals G, H, and I all have the value denoted "1."

In comparing the circuits illustrated in FIG. 1 and FIG. 3, it should be noted that in the diode gates, the polarity of the gate potential $Vgg$ is such that when binary input signals are present, or applied to the input terminals of the diode gates, that at least one of the diodes will be biased in the forward direction and will be conducting. As a result, there are no delays associated with turning off all the diodes of a gate, or turning on at least one or more of the diodes when they are all cut off.

With respect to the transistorized gates, the transistors of these gates are in the common collector configuration with a common emitter resistor. The values of the emitter and collector voltages and the resistance of the emitter resistor are chosen so that at least one of the transistors of each gate is always operating class A, i.e., it is neither cut off nor saturated when input signals of either of the proper two values are applied to their bases. For example, in FIGURE 1, if the excursion of the input signal on the base of transistors 38$a$ and 38$b$ is from 0 to −3.0 volts and the base of transistor 38$c$ remains at 0 volt, then the collector voltage $Vcc$ may be made −4.5 volts, that is, 1.5 volts more negative than the most negative excursion of the input signal. Such a value of collector voltage will prevent the base-to-collector junction from being forward biased even in the presence of that value of input signal which most strongly forwardly biases the base-to-emitter junction, thus preventing conduction of transistors 38*a* and 38*b* at saturation. The −3.0 volts on the bases of transistors 38*a* and 38b appears on the output and will render transistor 38*c* nonconducting because the base of transistor 38*c* is at 0 volt. Transistor 38*c* being nonconductive in no way increases the switching time of the circuit because for this example transistor 38*c* is in effect not part of the switching network and it is immaterial whether it is conducting or nonconducting. The pulses to the transistors 38*a*, 38*b* and 38*c* occur simultaneously in time and at regular time intervals. Therefore, if at one time interval a pulse is not applied to some, but not all, of the transistors, those transistors not receiving an input pulse will be rendered nonconductive. However, after the pulses have passed, all of the transistors will conduct again because 0 volt will be seen on the base of each of the transistors. Therefore, if in the next time interval a pulse is applied to a transistor that was cut off in the previous time interval it will find that transistor in a conducting state and will not be able to drive the transistor into the saturation region as was explained above. It becomes clear then that if in any time interval none or all of the transistors receive an input pulse none of the transistors will be cut off and that regardless of the input, at least one transistor will be conducting. Accordingly, the switching time of the network is not increased by one or more, but not all, of the transistors being cut off because the remaining conducting transistor or transistors give the switching network a continuous conducting current path. The emitter follower configuration produces current and power gain with near unity voltage gain and no signal inversion. However, if it is desired to invert the output of a transistorized gate, this can be done without adding an inverter by connecting a collector resistor between the source of collector potential and the collectors of the transistors to form a phase splitter, as is well known in the art. As a result, there is no need to provide separate and distinct amplifying stages between every two or three gates of a switching network, and amplifier circuits as such can be dispensed with in most switching networks used in digital data processing systems. The delays introduced by such amplifying circuits are thus eliminated. Also since the transistors of the transistorized gates that are in use at any given time are never saturated, or cut off, delay due to minority carrier storage in the bases of transistors are eliminated. Further, transistors having higher frequency characteristics such as PNIP, or drift transistors, can be used, with the result that the average delay per gate in the network will approach the theoretical minimum.

The maximum number of input terminals with which each gate is provided is determined by the desired operating speed, reliability, and the characteristic of their components and operating voltages. The number of input terminals actually used up to the maximum are determined by the network equations. The output terminals of the diode gates are generally designed to be connected to only one input terminal of a succeeding gate. The maximum number of input terminals that can be connected to the output terminal of a transistorized gate is determined by the circuit parameters, the desired maximum speed, reliability, etc. The actual number up to the maximum is again determined by the network equations. In the circuit illustrated in FIG. 1 having components and voltages of the values and type indicated and with the object of maximizing speed, reliability and the number of inputs and outputs, the value for $n$ is 4, the value of $m$ is 4, and output terminal 36 is capable of being connected to four subsequent gates.

The values and/or types of components and the voltages appearing on the drawings are included by way of example only, as being suitable for the circuits illustrated. It is to be understood that circuit specifications in accordance with this invention may vary from those appearing on the drawing.

Obviously, many modifications and variations of the present invention are possible in the light of the above teachings. It is therefore to be understood that within the scope of the appended claims, the invention may be practiced other than as specifically described and illustrated.

What is claimed is:

1. A switching network for binary signals having two predetermined levels comprising: first type gates and second type gates; each of the first type gates comprising a plurality of input terminals and an output terminal; a plurality of diodes, each of the diodes having two terminals; circuit means connecting one of the terminals of each of the diodes respectively to a different one of the input terminals; circuit means connecting the other terminal of each of the diodes to the output terminal, all the diodes being connected so that they are poled in the same direction, a gate resistor adapted to connect the output terminal of the first type gate to a source of gate potential, the value of the gate potential being such as to normally forward bias at least one of the diodes irrespective of which of the two levels the signals applied to the input terminals have: each of the second type gates comprising a plurality of semiconductor amplifying devices, each amplifying device having an emitter, a base, and a collector, circuit means connecting the base of each amplifying device respectively to an input terminal; circuit means connecting the emiters of all the amplifying devices to the output terminal, an emitter resistor having two terminals, one of the terminals of the emitter resistor being connected to the output terminal, the other terminal adapted to be connected to a source of operating potential for causing current to flow in the emitter collector circuit of at least one of the transistors, irrespective of which of the said two levels the signals applied to its input terminal have, and so that none of the transistors is ever saturated; said two types of gates producing binary signals at their output terminals of one or the other of said predetermined levels, which signals are predetermined functions of the binary signals applied to their input terminals; and circuit means for interconnecting the first and second type gates.

2. A switching network for binary signals having two predetermined levels comprising, first type gates and second type gates; each of the first type gates comprising a plurality of input terminals and an output terminal; a plurality of diodes; each of the diodes having two terminals; circuit means connecting one of the terminals of the diodes respectively to a different one of the input terminals; circuit means connecting the other terminal of each of the diodes directly to the output terminal; all the diodes being connected so that they are poled in the same direction; resistor circuit means for connecting the output terminal to a source of gate potential, the polarity of the source of gate potential being such as to cause at least one of the diodes to be forward biased irrespective of which of the levels the input signals have: each of the second type gates comprising a plurality of input terminals and an output terminal; a plurality of transistors, each transistor having an emitter, a base and a collector; circuit means connecting the base of each transistor respectively to a different input terminal; circuit means connecting the emitters of all transistors to the output terminal; resistor circuit means adapted to connect the output terminal to a source of emitter potential, the polarity of the emitter source being such as to normally forward bias at least one of the emitter base junctions of the transistors irrespective of which of said two levels the signals applied to the gates' input terminals have; circuit means adapted to connect the collectors of the transistors to a source of collector potential of such value that said transistors do not saturate irrespective of which of said two levels of signal is applied to the base; said gates producing binary output signals which are a predetermined function of the input signals applied to their input terminals; and circuit means adapted to interconnect said first and second type gates to form a switching network.

3. A switching network comprising interconnected mechanizations of the Boolean "or" and "and" functions, the mechanization of each of the "and" functions being a diode "and" gate: the mechanization of each of the "or" functions being comprised of a plurality of transistors, each of the transistors having an emitter, a base, and a collector; an emitter resistor; circuit means connecting the emitters of said transistors to one terminal of the emitter resistors, the other terminal of the emitter resistor adapted to be connetced to a source of emitter potential; circuit means adapted to connect the collectors of said transistors to a source of collector potential; each of the bases of the transistors being an input terminal; said one terminal of the emitter resistor being the output terminal of said "or" gate; the amplitudes of the source of emitter and collector potentials and the value of the emitter resistor being such that at least one transistor of each "or" gate operates in the class A region and none of the transistors ever saturate.

4. A switching metwork comprising interconnected mechanizations of the Boolean "or" and "and" functions, the mechanization of each of the "or" functions being a diode "or" gate: the mechanization of each of the "and" functions being comprised of a plurality of transistors, each of the transistors having an emitter, a base, and a collector; an emitter resistor; circuit means connecting the emitter of the transistors to one terminal of the emitter resistor, the other terminal of the emitter resistor adapted to be connected to a suitable source of emitter potential; circuit means adapted to connect the collectors of the transistors to a source of collector potential; the bases of each of the transistors being an input terminal of the "and" gate; said one terminal of the emitter resistor being the output terminal of the "and" gate, the ampulitudes of the source of emitter potential and collector potential and the resistance of the emitter resistor being such that at least one of the transistors operates in the class A region, and none of the transistors saturates.

5. A switching network for two valued signals comprising interconnected mechanizations of the "and" and "or" logical functions; the mechanization of each "and" function comprising a plurality of input terminals and an output terminal; a plurality of diodes, each diode having an anode and a cathode; circuit means connecting each anode respectively to an input terminal of the mechanization of the "and" function; circuit means directly connecting the cathode of each diode to the output terminal; resistor means adapted to connect said output terminal to a source of negative potential; the mechanization of each "or" function comprising a plurality of input terminals and output terminal; a plurality of PNP transistors, each transistor having a base, an emitter and a collector; circuit means connecting each base respectively to a different input terminal of the mechanization of the "or" function; circuit means directly connecting all the emitters of the transistor to the output terminal of the mechanization of the "or" function; circuit means adapted to connect all the collectors of the transistor to a negative source of collector potential, and resistor means adapted to connect the output terminal of the mechanization of the "or" function to a positive source of emitter potential; the values of the collector and emitter potentials being such that at least one of the transistors conduct without saturating when the signals applied to its input terminals have one or the other of said two values.

6. A switching network for two valued signals comprising interconnected "and" and "or" gates, each "or" gate comprising a plurality of input terminals and an output terminal, a plurality of diodes, each of the diodes having an anode and a cathode, circuit means connecting all the anodes to the output terminal of the "or" gate, circuit means connecting the cathode of each diode respectively to a different input terminal of the "or" gate, a gate resistor, said gate resistor connecting the output terminal to a source of positive gate potential; each "and" gate comprising a plurality of input terminals and an output terminal, a plurality of NPN transistors, each transistor having a base, an emitter and a collector; circuit means connecting each base respectively to an input terminal of the "and" gate, circuit means directly connecting the emitters to the output terminal, circuit means for connecting the collectors to a positive source of collector potential, an emitter resistor connecting the output terminal to a negative source of emitter potential; the values of the collector and emitter potential being such that at least one transistor in each gate is conducting in the class A region irrespective of which of the two possible values the signals applied to its input terminal have, and none of the transistors is ever saturated.

7. A switching network comprising: interconnected "and" and "or" gates, each "or" gate having a plurality of input terminals and an output terminal, a plurality of junction diodes; each diode having an anode and a cathode; circuit means connecting the cathode of each diode respectively to a different input terminal; circuit means connecting the anodes of the diodes to the output terminal; a gate resistor having two terminals, one terminal being connected to the output terminal and the other terminal adapted to be connected to a source of positive gate potential: each of the "and" gates having a plurality of input terminals and an output terminal, a plurality of NPN transistors, each transistor having a base, an emitter and a collector; circuit means connecting the base of each transistor respectively to a different input terminal of the gate; circuit means connecting all the emitters of the transistors to the output terminal; circuit means connecting the collectors of all the transistors to a positive source of collector potential; an emitter resistor having two terminals, one terminal being connected to the output terminal of the "and" gate and the other terminal adapted to be connected to a negative source of emitter potential, the values of the emitter and collector potentials being such that none of the transistors saturate and at least one of the transistors is conducting.

8. In combination; at least a single logical "and" gate and at least a single logical "or" gate connected in tandem, one of said gates comprising a plurality of diodes connected in parallel to a common output line connected by way of a common impedance to a source of diode forward-biasing potential, said one gate being arranged for receiving at each diode one of a plurality of input signals having one or the other of two values of potential for delivering to said common line in response to such input signals a single output signal having one or the other of said two values, the other of said gates comprising a plurality of transistors connected in parallel having their collectors connected to a source of collector supply voltage and their emitters connected to a common output line connected by way of a common emitter load impedance to a source of emitter biasing potential, said other gate being arranged for receiving at the base of each of said transistors one of a plurality of input signals having one or the other of said two values of potential and for delivering to said common output line of said other gate in response to such input signals a single output signal having one or the other of said two values, said source of emitter biasing potential and said source of collector supply voltage having such value that the emitter-to-base junction of at least one of said transistors remains forward biased and the collector-to-base junction remains reverse biased irrespective of which of said two values of input signal is applied to the base of the transistor, thereby to maintain at least one of said transistors always conducting but never saturated irrespective of which of said two values of input signal is applied to the base; and means for applying the output signal on the common output line of one of said gates as an input signal to the other gate.

9. The combination as claimed in claim 8 characterized in that the logical "and" gate is the gate comprising a plurality of diodes and in that the logical "or" gate is the gate comprising a plurality of transistors.

10. The combination as claimed in claim 8 characterized in that the logical "and" gate is the gate comprising a plurality of transistors and in that the logical "or" gate is the gate comprising a plurality of diodes.

References Cited in the file of this patent

UNITED STATES PATENTS

| | | |
|---|---|---|
| 2,816,225 | Bliss | Dec. 10, 1957 |
| 2,823,856 | Booth et al. | Feb. 18, 1958 |
| 2,836,359 | Mazzagatti | May 27, 1958 |
| 2,872,593 | Henle | Feb. 3, 1959 |
| 2,873,363 | Wanlass | Feb. 10, 1959 |
| 2,888,578 | Bruce | May 26, 1959 |
| 2,928,010 | Campbell | Mar. 8, 1960 |
| 2,990,478 | Scarbrough | June 27, 1961 |
| 2,990,479 | Henle | June 27, 1961 |

OTHER REFERENCES

Richards: "Arithmetic Operations in Digital Computers," published by Van Nostrand, New York, N.Y., 1955.

Richards: "Digital Computer Components and Circuits," published by Van Nostrand, New York, N.Y., 1957.